United States Patent
O'Donnell

(10) Patent No.: US 6,396,545 B1
(45) Date of Patent: May 28, 2002

(54) METHOD FOR DIGITAL SYNCHRONIZATION OF VIDEO SIGNALS

(75) Inventor: Ciaran Gerard O'Donnell, Santa Clara, CA (US)

(73) Assignee: Koninklijki Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/259,715

(22) Filed: Mar. 1, 1999

(51) Int. Cl.[7] .................................................. H03L 7/00
(52) U.S. Cl. ........................ 348/537; 375/373; 327/163; 327/155; 331/1 A; 331/20
(58) Field of Search .................................. 348/497, 498, 348/499, 500, 536, 537, 540, 512; 331/2, 14, 17, 1 A, 1 R, 25, 20; 327/155, 156, 162, 163; 375/362, 371, 377, 373; H04N 5/04

(56) References Cited

U.S. PATENT DOCUMENTS

| | | | |
|---|---|---|---|
| 4,577,163 A | 3/1986 | Culp | 331/1 A |
| 5,473,285 A | * 12/1995 | Nuckolls et al. | 331/1 A |
| 5,559,812 A | 9/1996 | Otaki et al. | 371/31 |
| 5,726,607 A | * 3/1998 | Brede et al. | 331/2 |
| 5,808,691 A | 9/1998 | Malcolm, Jr. et al. | 348/537 |
| 6,118,344 A | * 9/2000 | Toshitani et al. | 331/1 R |

FOREIGN PATENT DOCUMENTS

| | | | | |
|---|---|---|---|---|
| EP | 0564272 A2 | 10/1993 | | H04N/5/95 |
| EP | 0595013 A2 | 5/1994 | | H03L/7/099 |

* cited by examiner

*Primary Examiner*—Michael H. Lee
(74) *Attorney, Agent, or Firm*—Daniel J. Piotrowski

(57) ABSTRACT

A Time Based Correction (TBC) method for digital synchronization of video signals. The time based correction method may be used for satellite based communications to keep clocks synchronized in a multimedia system. Digital receiver clock phases are compared to measure synchronization. The method includes an initialization procedure (tbcInit) that initializes algorithm variables and sets up an initial phase; a measurement procedure (tbcGetPhase) that measures the current phase; and a tracking procedure (tbcAdjust) that makes periodic adjustments to the output clock (VO_CLOCK).

25 Claims, 4 Drawing Sheets

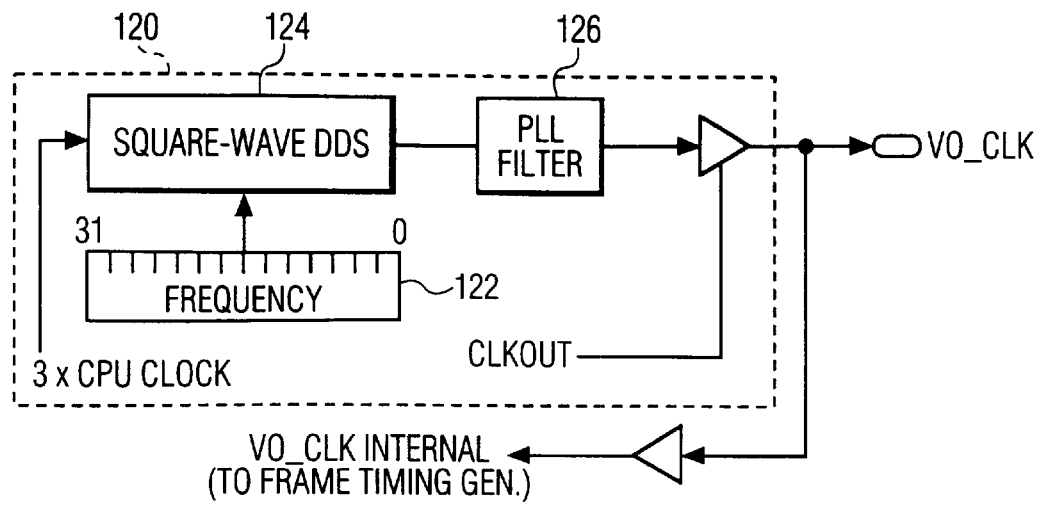
FIG. 3
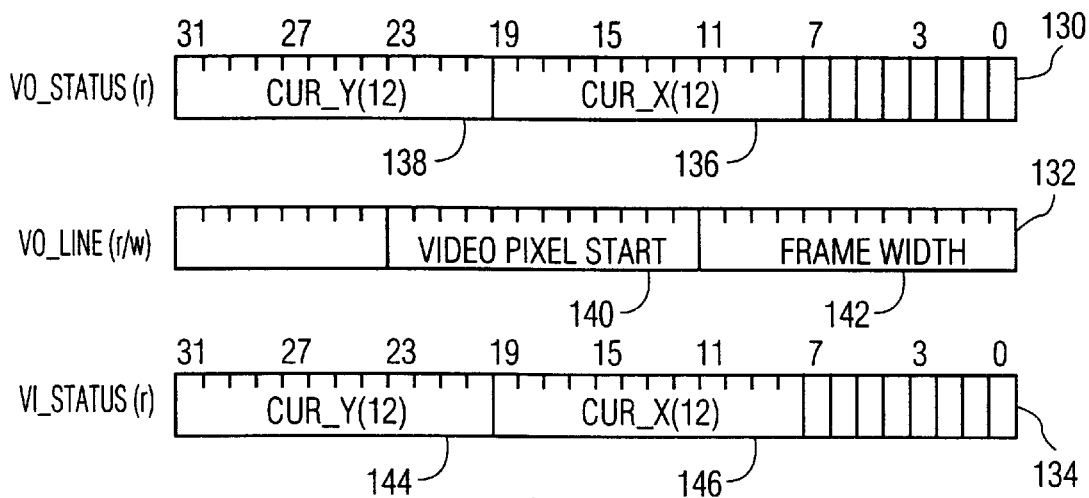
FIG. 4
| 150 | REGISTER | FIELD | 525/60 VALUE | 625/50 VALUE |
|---|---|---|---|---|
| 154 | VO_CLOCK | FREQUENCY | 170A3D70h | 170A3D70h |
| 152 | VO_LINE | FRAME WIDTH | 858 | 864 |
| | | VIDEO PIXEL START | 138 | 144 |
FIG. 5

METHOD FOR DIGITAL SYNCHRONIZATION OF VIDEO SIGNALS

BACKGROUND OF THE INVENTION

The present invention is related to digital synchronization of video signals and, more particularly, to a time base error correction scheme to keep video input and output clocks in synchronization in a multimedia system.

Synchronizing data between a transmitter and receiver is a well known broadcast problem. No matter how finely tuned and calibrated the receiver clock never matches the transmitter clock, exactly. This problem is exacerbated by transmission delays and other interference. This clock synchronization problem is especially sensitive in multimedia based data streams.

FIG. 1 depicts an example of a prior art time based correction problem. A satellite 100 provides an analog video signal represented by arrows 102 to a set top box 104 which includes a digital processor (not shown). The satellite 100 provides the signal at a clock rate that is independent of digital signal processor. The set top box 104 receives the signal and provides a video output signal to a TV set 106. The video output frequency from the set top box 104 is synchronized to, or, derived from a clock generated by an on-board oscillator, i.e. in the set top box 104.

The on-board clock will never provide the video output signal at exactly the same clock rate as that of the satellite 100. The on-board clock frequency will either be too high or too low, i.e., the clock will be too fast or, too slow. Further, over a long period of time, to correct any resulting error and resynchronize the two signals, video frames will have to be dropped if the clock is too fast or, empty frames will have to be produced and inserted into the video output if the clock is too slow.

A related time base error correction problem is encountered in consumer electronics products such as VCRs or laser (video) disk players. A prevalent approach taken in the prior art for correcting time base error of video signals in VCRs and video disk players involves the use of memory buffers. Representative of this prior art are European Patent Application 0 564 272 A2, to Takeshita et al., and U.S. Pat. No. 5,559,812, to Otaki et al. This approach essentially involves capturing a digital sample window of the input signal and inserting and removing data elements thereinto/ therefrom. This approach has several significant disadvantages. Foremost amongst these disadvantages is the fact that memory buffers are required and are required to be proportional in size to the degree of jitter present, which imposes a significant hardware cost penalty. Further, inserting and suppressing data degrades the quality of the video signal. Finally, the clock signal itself is not corrected.

In general, this time base error correction problem has several elements that must be addressed. A first element is achieving frequency lock in the system using a digital processor for treatment of multimedia signals. A second element is achieving frequency lock at a particular phase. The difference in phase corresponds to the quantity of the signal stored digitally. This is important because controlling Random Access Memory (RAM) costs is an important factor in overall system cost. A third element occurs when the application must deal with non-continuous shifts in phase. This third element is a consideration when the signal source is mechanical equipment such as a Video Cassette Recorder (VCR).

One approach to solving the above time base error correction problem is to add hardware to slave the video output clock to the video input clock. This approach has been used in combination with analog or digital hardware. However, this approach requires a fixed timing delay calculation which is much more difficult with a digital signal processor. Another approach involves modeling the time base error correction problem as a control theory problem. The video input and output signals can be modeled as a system of partial differential equations with the frequency being modeled as a phase differential. Yet another approach is to use fuzzy logic to model the problem. Using this fuzzy logic approach, look up tables are derived for a variety of different input and output phase ranges. The look up table provides a discrete output frequency for each different input and output phase range. However, because the values are from a table, adjustments are discrete. Further, extensive experimentation for parameterization may be required.

Based on the above and foregoing it can be appreciated that there presently exists a need in the art for a time based correction method for digitally synchronizing video signals that overcomes the above-described disadvantages and shortcomings of the presently available technology. The present invention fulfills this need in the art.

SUMMARY OF THE INVENTION

The present invention encompasses a Time Based Correction (TBC) method for digital synchronization of video signals. The time based correction method of the present invention keeps clocks synchronized in a multimedia system in a precise, accurate, and stable manner. The method includes an initialization procedure (tbcInit) that initializes algorithm variables and sets up an initial phase; a measurement procedure (tbcGetPhase) that measures the current phase; and a tracking procedure (tbcAdjust) that makes periodic adjustments to the output clock (VO_CLOCK). In addition to locking clocks, the method of the present invention allows control over input to output latency, reduces buffer requirements and improves image quality. In fact, since the method of the present invention requires only combinatorial logic to make the requisite clock adjustments, it eliminates the need for memory altogether, which constitutes a significant hardware cost savings relative to the presently available technology.

BRIEF DESCRIPTION OF THE DRAWINGS

These and various other features and advantages of the present invention will be readily understood with reference to the following detailed description taken in conjunction with the accompanying drawings, in which:

FIG. 3 is an example of a Video Output (VO) clock system that is controlled by a VO_CLOCK register of a VO unit;

FIG. 4 is an example of a VO_STATUS register, a VO_LINE register and a VI_STATUS register;

FIG. 5 is a table that includes initialization examples for the PAL and NTSC standards;

DETAILED DESCRIPTION OF THE INVENTION

By way of example, the present invention is described within the context of a digital signal processor capable of continuously measuring satellite communications input and output phases and controlling the output frequency. By way of example only, the present invention is described, and can be understood with reference to, the TriMedia processor from Phillips Electronics North America Corporation, and more particularly the TriMedia TM1000 processor. Accordingly, reference is made to Chapter 7 of the TriMedia TM1000 Preliminary Data Book, Philips Electronics North America Corporation, 1997.

Figure 1:
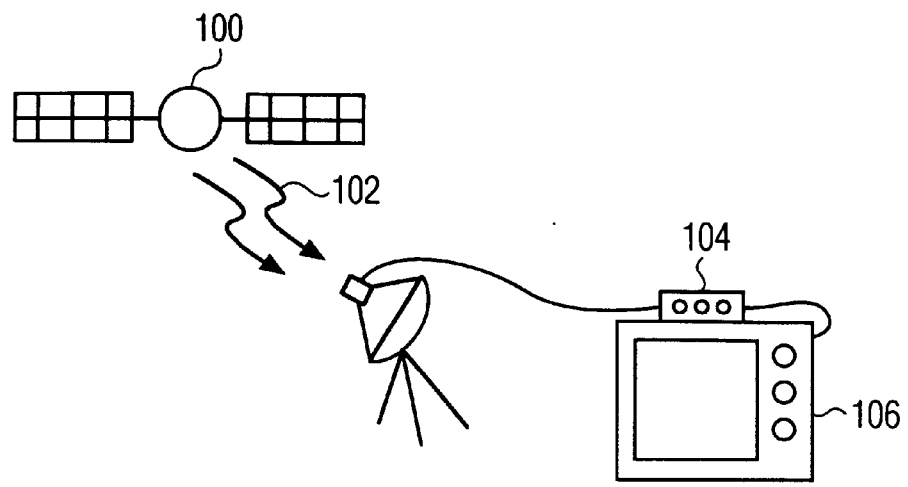
FIG. 1 shows an example of a prior art time based correction problem.
Figure 2:
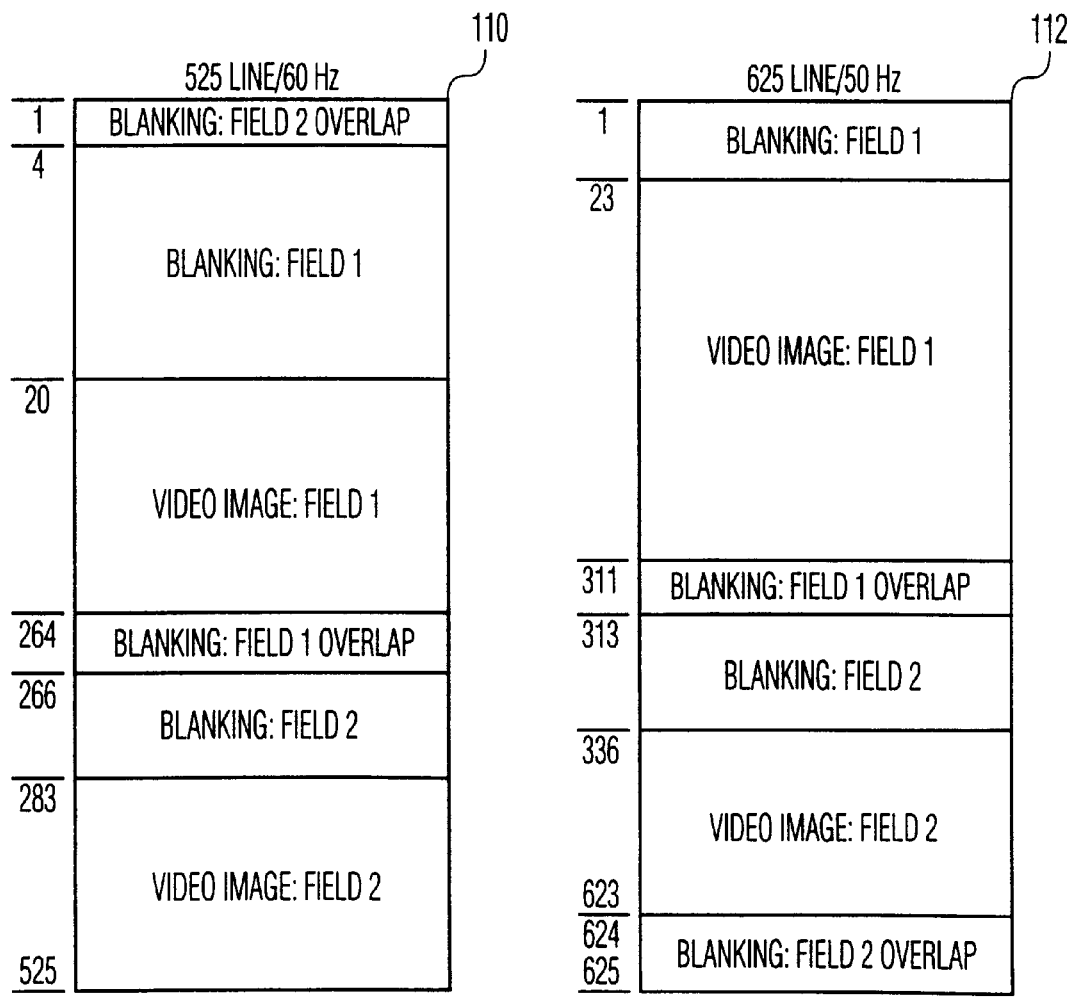
FIG. 2 is a table comparing a NTSC video signal frame with PAL video signal frame.

Also, the present invention is described in terms of two well-known video signal standards, PAL and NTSC which have similar timing but differ in line numbering. The table in FIG. 2 provides a frame comparison of the NTSC video signal 110 with the PAL video signal 112. The NTSC video signal 110 is defined as being 525 lines per frame and 60 frames per second. The PAL video signal 112 is defined as being 625 lines per frame and 50 frames per second.

FIG. 3 is an example of a Video Output (VO) clock system 120 which is controlled by a register, VO_CLOCK register 122, of the VO unit 120. The clock generator system includes a square wave Direct Digital Synthesizer (DDS) 124. The DDS 124 of this example provides a frequency between 8 and 40 MHz with a resolution of 0.07 Hz. The output of the DDS 124 is sent to a phase lock looped filter 126, which removes clock jitter from the DDS output signal. The DDS is programmed by setting the VO_CLOCK register 122 to satisfy the following equation (1);

$$FREQUENCY_{DDS} = \frac{3 * VO\_CLOCK * F_{CPUCLOCK}}{2^{32}} \quad (1)$$

FIG. 4 is an example of three TM1000 status registers, the VO_STATUS register 130, the VO_LINE register 132 and the VI_STATUS register 134. The VO_STATUS register 130 is a read only register that holds the current pixel position, CUR_X 136 and CUR_Y 138. CUR_Y 138 corresponds to the current pixel line number and CUR_X 136 corresponds to the pixel location within that line. The line format is encoded in VO_LINE register 132. It should be noted with respect to the VO_LINE register 132 that:
 a) values of CUR_X 136 between 0 and VIDEO_PIXEL_START 140 correspond to the horizontal blanking interval; and
 b) values of CUR_X 136 between VIDEO_PIXEL_START 140 and FRAME_WIDTH 142 correspond to the active video line.

A video in (VI) peripheral accesses the video input signal. This access includes the VI_STATUS register 134, as well as other input and clock phase registers. A clock phase register (not shown) is accessed as read only. The video input signal can also be decomposed into two fields, CUR_X 144 and CUR_Y 146, corresponding to the X and Y pixel positions. FIG. 5 is a table 150 that provides initialization examples for the PAL and NTSC standards in particular for VO_LINE 152 and VO_CLOCK 154. In line 154 the VO_CLOCK FREQUENCY value corresponds to 27 MHz. The video input is a digital video signal, preferably in CCIR 601 format. The input clock is encoded in the same format. It should be noted that, normally, the input frequency cannot be measured directly. Therefore, the input and output phases are the measurement variables.

Figure 6:
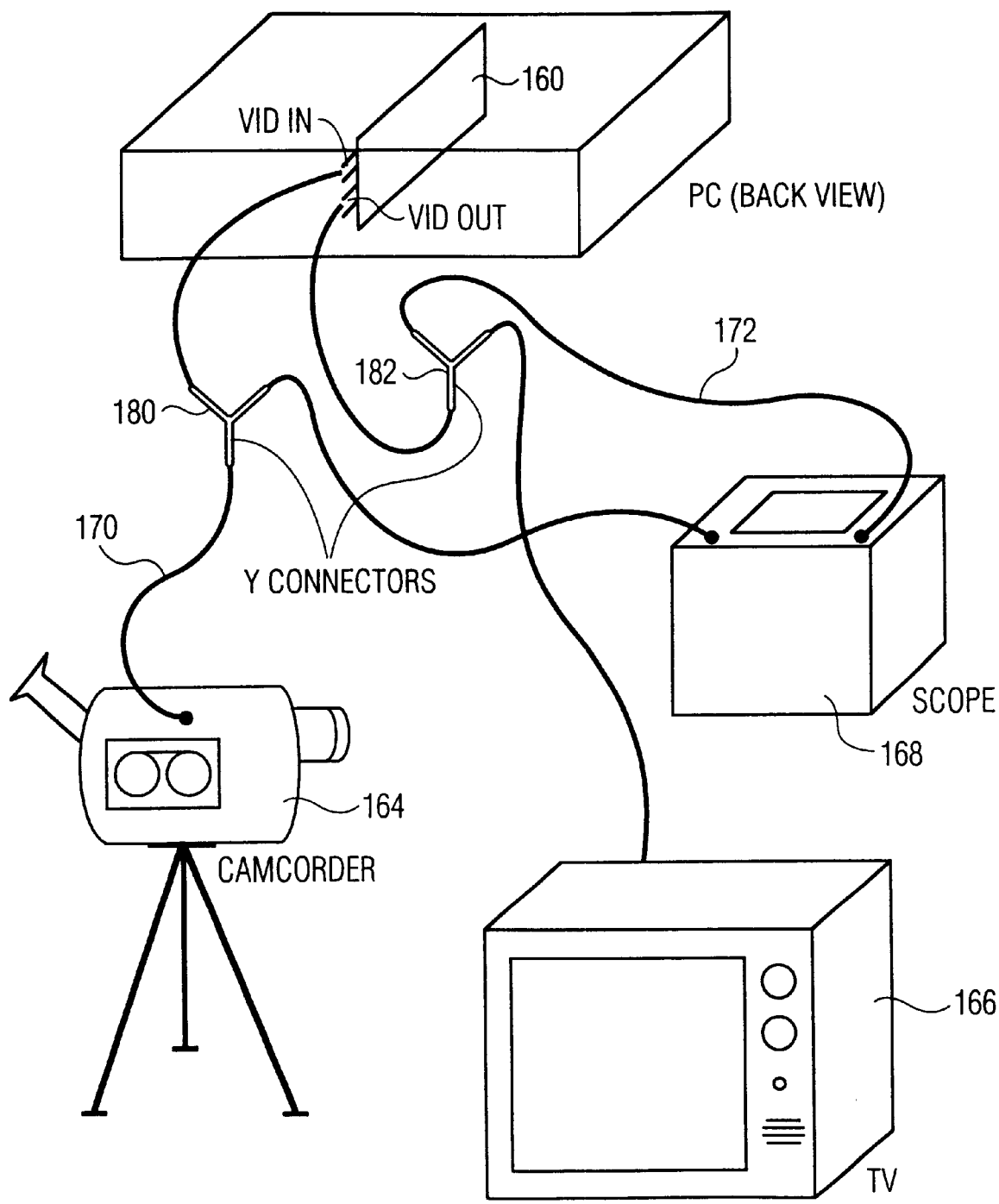
FIG. 6 is an arrangement for experimentally observing the clock drift problem; and, FIG. 7 is a flow diagram for the method of time based correction in accordance with a preferred embodiment of the present invention.

The clock drift problem has been observed, experimentally, using the arrangement of FIG. 6 with the Software Development Environment (SDE) provided with the TM1000. In particular, the clock drift problem was exhibited on a TriMedia IREF board 160, using the vivot demonstration program included in the SDE. The arrangement includes a camcorder 164 to generate an input signal, a TV set 166 to observe an output, a two channel oscilloscope 168 (bandwith is not critical) to measure the drift error, two video cables 170, 172 connected to the IREF board 160, and two Y connectors 180 and 182. The video cable 170 takes the signal generated from the camcorder 164 and sends it to the IREF board 160 VIDin port. The Y connector 180 is used to simultaneously observe the signal on the first channel of the oscilloscope 168. The video cable 172 takes the signal from the VIDout port of the IREF board 160 and displays it on the TV set 166. The Y connector 182 is used to observe the signal on the second channel of the oscilloscope 168. The video signals VIDin and VIDout are composite video signals.

Alternatively, the oscilloscope input may be connected to the Luma pin of the S-video connector from the output of the IREF board 160. The Luma pins contain information corresponding to a black and white TV signal.

To observe clock drift, the horizontal synchronization signal was observed on the oscilloscope 168. This is not easy to observe directly and requires schematics and an extender card, and the probes must be placed on the board 162. The measurement can be performed in a much more straightforward manner by producing a video input signal corresponding to a dark image, since only synchronization signals are contained in a dark signal. In this connection, a camcorder can be placed inside a desk drawer in order to produce a dark signal.

The vivot demonstration program allows the locked in phase difference to be set. In this experiment, convergence was observed for a phase difference between −0.35 (−126°) and 0.25 (+90°). Empirical measurement of the phase difference between signals requires observing the horizontal sync signal on the output board 162.

Accordingly, having appreciated the problem, the present invention corrects the time base error by applying adjustments to the clock frequency to adjust the phase. If the phase difference is negative (video output is running behind video input), the output frequency should be increased. If the phase difference is positive, the output frequency should be decreased. The adjustment function of the present invention is supra linear, because adjustments must be small when clock drift is small, and much greater when clock drift is larger.

Figure 7:
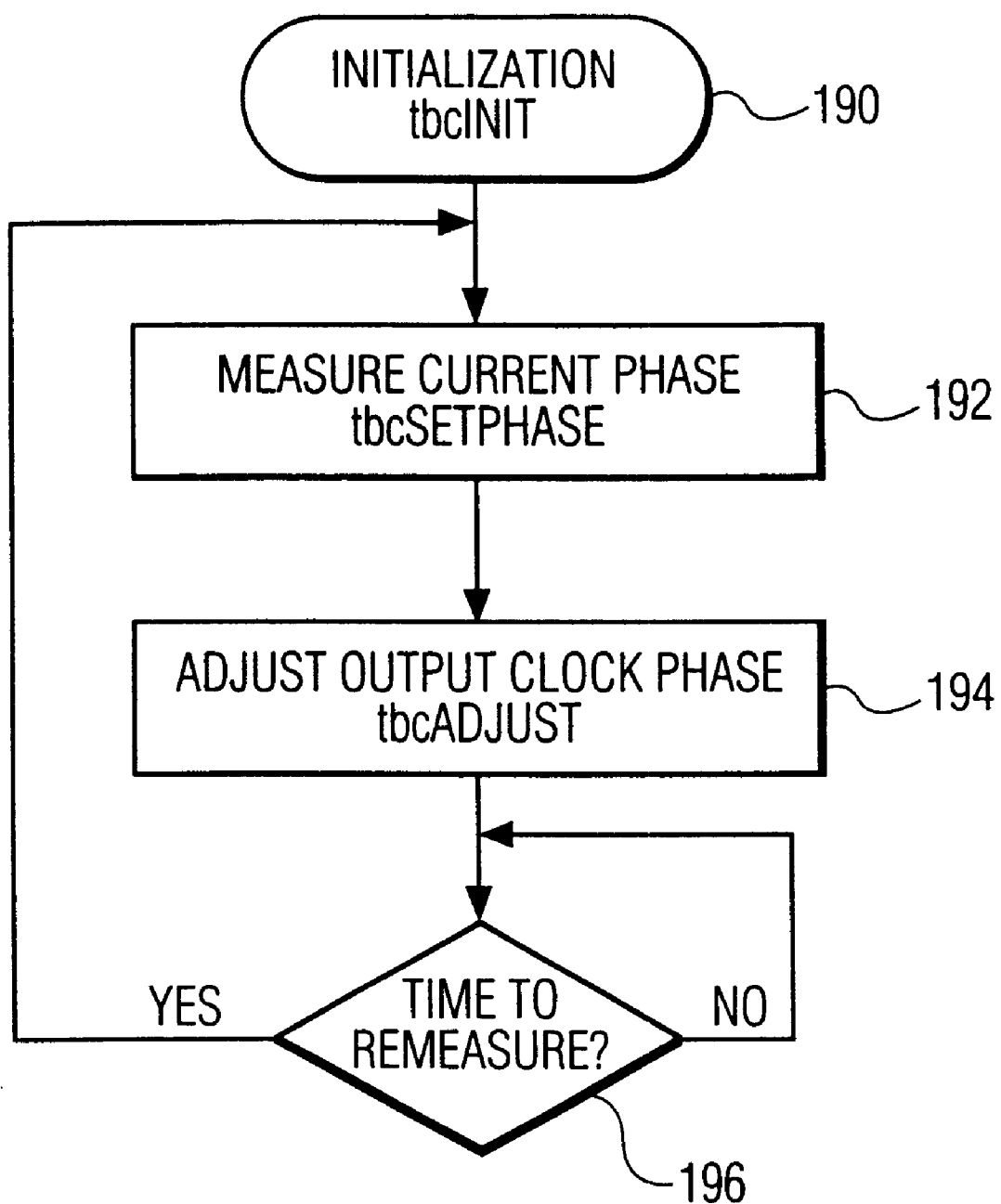

Accordingly, the preferred embodiment of the time based correction method of the present invention, shown in FIG. 7, can be implemented with minimal hardware cost. The only hardware required is a single multiplier accumulator, a comparator, and some control logic and registers for latching and ordering computations. The present invention has been shown, empirically, to be both stable and convergent without overshoot. The simplicity of the invention lends itself to mathematical analysis for boundary conditions of convergence and may be implemented with a digital processor or, a hardware processor (e.g. modem, short wave radio).

The Time Based Correction (TBC) method of the present invention requires:
 (1) An initialization procedure (tbcInit) that initializes algorithm variables and sets up an initial phase;
 (2) A measurement procedure (tbcGetPhase) that measures the current phase; and
 (3) A tracking procedure (tbcAdjust) that makes periodic adjustments to the output clock (VO_CLOCK).

First, the initialization procedure, tbcInit, in step 190 is called to initialize the parameters of the TBC algorithm. The variables and their corresponding initialization values are shown in the table of FIG. 5. A skew parameter is set by calling the tbcGetPhase procedure as shown in the following equation (2):

$$VO_{skew} = tbcGetPhase \qquad (2)$$

The value provided for $VO\_CLOCK_{start}$ is used as an initial value for $VO\_CLOCK$. The $VO\_CLOCK_{min}$ and $VO\_CLOCK_{max}$ values correspond to clamps. The CPU clock frequency, $F_{CPUCLOCK}$, in the experimental set-up, was 100 MHz. The $VO_{gain}$ factor is an algorithm parameter corresponding to convergence.

Next, in the tbcGetPhase procedure of step 192, the current phase skew is measured. First $VI_{phase}$ and $VO_{phase}$ are computed according to the following relationship:

$$VO_{phase} = \frac{CUR\_X * FRAME\_HEIGHT_{VO} + CUR\_Y}{FRAME\_HEIGHT_{VO} * FRAME\_WIDTH_{VO}}$$

$$VI_{phase} = \frac{CUR\_X * FRAME\_HEIGHT_{VI} + CUR\_Y}{FRAME\_HEIGHT_{VI} * FRAME\_WIDTH_{VI}}$$

The numerator in each of the above equations corresponds to the phase in bit positions. Dividing by the denominator brings the magnitude of the calculated phase into a range between 0 and 1. Accordingly, the range of the clock skew is between −1 to 1. The video formats of VO and VI need not be identical, but may be used in combination with an appropriate format conversion.

A single multiplier accumulator (MAC) is required for a preferred hardware implementation. In a typical such implementation, a finite state machine would be used for a separate computation of $VO_{phase}$ and $VI_{phase}$. The MAC may also be used during the tracking procedure, tbcAdjust.

The periodic tracking procedure, tbcAdjust, in step 194 is the heart of the time based correction procedure. Preferably, a cubic function is used for adjustment and, has been shown, experimentally to be excellent for this purpose. First a skew/phase difference is determined according to the equation (3):

$$DIFF = (VO_{skew} - VO_{phase}) * VO_{gain}. \qquad (3)$$

The $VO_{gain}$ parameter is a constant which is used to increase the gain (responsiveness) of the time based correction procedure. Increasing the value of $VO_{gain}$ reduces the time to convergence and allows the algorithm to deal with greater differences in phase without dropping or losing frames. Decreasing the value of $VO_{gain}$ increases sensitivity and stability. An appropriate value for $VO_{gain}$ can be rapidly determined using an experimental set-up, such as the one described herein, to observe convergence.

Next, DIFF is clamped to maximum and minimum bounds according to the following relationship (4):

$$DIFF = \min(VO\_CLOCK_{max}, \max(VO\_CLOCK_{min}, DIFF)). \qquad (4)$$

Clamping is necessary to avoid excessive adjustments to the value of $VO\_CLOCK$ which causes color burst loss. Finally, in the tbcAdjust phase, the clock frequency is computed according to the following equation (5):

$$VO\_CLOCK = (1.0 + DIFF)^3 * VO\_CLOCK_{start}. \qquad (5)$$

From the frame width and height provided in the table of FIG. 5, the clock skew can be measured from the clock phases according to the following equation (6):

$$VO_{skew} = VO_{phase} - VI_{phase}. \qquad (6)$$

The new computed value is programmed in the VO_CLOCK register 122 with the relationship: (VO_CLOCK)=DIFF.

The tbcGetPhase procedure is invoked, periodically, thereafter in step 196, preferably, at the video input clock frequency. However, the tbcGetPhase procedure can be executed at any selected periodic interval. For example, a timer interrupt may be used to invoke the tbcGetPhase procedure.

Application of the time based correction method of the present invention in a VCR requires means to compute the phase. A sampling frequency should be chosen which is an integer divisor of the base pixel frequency, e.g., the line or pixel frequency. Computing the phase requires line and/or pixel counter means, typically already available in the VCR itself. Any choice of divisor can be used, the tradeoff being between clock resolution and the length of the adjustment period.

Thus, the phase difference between input and output clocks is corrected using a non-linear function of a single variable. The result of the non-linear function is applied multiplicatively to the output frequency reference, i.e, line and pixel frequency in a video application. The magnitude of the correction corresponds to the magnitude of the phase differences. The preferred method results in quick convergence and excellent stability.

Use of the invention to achieve lock in at a particular phase is straightforward. From equation (3), it can be seen that convergence is achieved when the following condition is met:

$$VO_{skew} = VO_{phase}$$

Setting $VO_{skew}$ to any desired value causes the algorithm to converge at that phase. The algorithm as described best deals with continuous change of phase. In some applications, non-continuous phase jumps are possible, e.g., in VCRs. Such non-continuous phase jumps can be detected by detecting the occurrence of one of the two following conditions (a) or (b) during the computation of DIFF in accordance with equation (4):

$$DIFF = VO\_CLOCK_{min} \qquad (a) \text{ Or,}$$

$$DIFF = VO\_CLOCK_{max} \qquad (b)$$

In a hardware implementation of the present invention, this information is directly available.

Although a presently preferred embodiment of the present invention has been described in detail hereinabove, it should be clearly understood that many variations and/or modifications of the basic inventive concepts herein taught which may appear to those skilled in the pertinent art will still fall within the spirit and scope of the present invention as defined in the appended claims.

What is claimed is:

1. A method for digital synchronization of an input signal supplied at a first frequency under control of a source clock and an output signal supplied at a second frequency under control of an output clock, the method comprising the steps of:

a) initializing variables of a time base correction algorithm;
b) measuring a current phase difference between the source clock and the output clock;
c) adjusting the output clock frequency responsive to the current phase measurement; and
d) periodically repeating steps (b) and (c);
   wherein steps (b) and (c) are performed using the time base correction algorithm,
wherein step (c) is performed using a cubic function.

2. A method for digital synchronization of an input signal supplied at a first frequency under control of a source clock and an output signal supplied at a second frequency under control of an output clock, the method comprising the steps of:
a) initializing variables of a time base correction algorithm;
b) measuring a current phase difference between the source clock and the output clock;
c) adjusting the output clock frequency responsive to the current phase measurement; and
d) periodically repeating steps (b) and (c);
   wherein steps (b) and (c) are performed using the time base correction algorithm,
wherein step (c) is performed by adjusting the output clock frequency in a supra linear manner.

3. A method for digital synchronization of an input signal supplied at a first frequency under control of a source clock and an output signal supplied at a second frequency under control of an output clock, the method comprising the steps of:
a) initializing variables of a time base correction algorithm;
b) measuring a current phase difference between the source clock and the output clock;
c) adjusting the output clock frequency responsive to the current phase measurement; and
d) periodically repeating steps (b) and (c);
wherein steps (b) and (c) are performed using the time base correction algorithm, wherein the measuring step (b) includes determining an input phase and an output phase and the input phase is determined responsive to a current input signal location within an input frame and step (c) is performed using a non-linear function.

4. The method of claim 3 wherein the input phase has a magnitude between 0 and 1.

5. The method of claim 4 wherein the current input signal location includes a current x location (CUR_X) and a current y location (CUR_Y), the input frame includes a frame height (FRAME_HEIGHT$_{VI}$) and a frame width (FRAME_WIDTH$_{VI}$) and the input phase is determined according to the relationship:

$$VI_{phase} = \frac{CUR\_X * FRAME\_HEIGHT_{VI} + CUR\_Y}{FRAME\_HEIGHT_{VI} * FRAME\_WIDTH_{VI}}.$$

6. The method of claim 3 wherein the output phase is determined responsive to a current output signal location within an output frame.

7. The method of claim 6 wherein the output phase has a magnitude between 0 and 1.

8. The method of claim 7 wherein the current output signal location includes a current x location (CUR_X) and a current y location (CUR_Y), the output frame includes a frame height (FRAME_HEIGHT$_{VO}$) and a frame width (FRAME_WIDTH$_{VO}$) and the output phase is determined according to the relationship:

$$VO_{phase} = \frac{CUR\_X * FRAME\_HEIGHT_{VO} + CUR\_Y}{FRAME\_HEIGHT_{VO} * FRAME\_WIDTH_{VO}}.$$

9. The method of claim 7 wherein in the adjustment step (c), a signal skew (VO$_{skew}$) is determined by subtracting the input phase from the output phase.

10. The method of claim 9 wherein the adjustment step (c) further comprises:
i) determining a skew/phase difference;
ii) clamping the determined skew/phase difference within a minimum and maximum bound; and
ii) adjusting the output clock responsive to the clamped skew/phase difference.

11. The method of claim 10 wherein in step (i) the skew/phase difference is determined by multiplying the difference between the signal skew (VO$_{skew}$) and the output phase (VO$_{phase}$) by a gain factor (VO$_{gain}$).

12. The method of claim 11 wherein in the clamping step (ii), the skew/phase difference (DIFF) is bounded by a minimum output clock phase (VO_CLOCK$_{min}$) and a maximum output clock phase (VO_CLOCK$_{max}$) according to the relationship:

DIFF=min(VO_CLOCK$_{max}$, max(VO_CLOCK$_{min}$, DIFF)).

13. The method of claim 12 wherein in the clock adjusting step (iii), the output clock (VO_CLOCK) is adjusted relative to an initial output clock (VO_CLOCK$_{start}$) according to the relationship:

VO_CLOCK=(1.0+DIFF)$^3$*VO_CLOCK$_{start}$.

14. The method of claim 10 wherein in step (d), steps (b) and (c) are repeated at the input clock frequency.

15. The method of claim 10 wherein in step (d), steps (b) and (c) are repeated responsive to a timer interrupt.

16. The method of claim 1 wherein the input signal is received in a set top box as a broadcast signal from a satellite, and the output signal is supplied to a television set.

17. The method of claim 1 wherein the input signal is received in a television set as a recorded video signal.

18. An apparatus that receives an input signal supplied at a first frequency under control of a source clock and an output signal supplied at a second frequency under control of an output clock, the apparatus including a digital time base corrector programmed to digitally synchronize the input and output signals by executing a time base correction algorithm that determines a phase difference between the input and output clocks and adjusts the frequency of the output clock as a non-linear function of the determined phase difference, wherein the adjustment of the frequency of the output clock is made by multiplying an output of the non-linear function by a reference frequency.

19. The apparatus as set forth in claim 18, wherein the input and output signals are video signals, and the reference frequency is the line or pixel frequency of the output video signal.

20. The apparatus as set forth in claim 18, wherein the input and output signals are video signals.

21. The apparatus as set forth in claim 18, wherein the apparatus is a set-top box that receives a digital video signal broadcast from a satellite as the input signal.

22. The apparatus as set forth in claim 18, wherein the apparatus is a VCR that receives a recorded video signal from a videocassette as the input signal.

23. The apparatus as set forth in claim 18, wherein the non-linear function is a cubic function.

24. The apparatus as set forth in claim 18, wherein the non-linear function is a supra linear function.

25. The apparatus as set forth in claim 18, wherein the digital time base corrector includes only combinatorial logic and does not include a buffer memory.

* * * * *